US009315376B2

(12) United States Patent
Roland et al.

(10) Patent No.: US 9,315,376 B2
(45) Date of Patent: Apr. 19, 2016

(54) PLANAR STRUCTURE FOR A TRIAXIAL GYROMETER

(75) Inventors: Iannis Roland, Clinchy (FR); Steve Masson, Le Plessis Robinson (FR); Olivier Ducloux, Le Creusot (FR)

(73) Assignee: ONERA (OFFICE NATIONAL D'ETUDES ET DE RECHERCHES AEROSPATIALES), Chatillon (FR)

( * ) Notice: Subject to any disclaimer, the term of this patent is extended or adjusted under 35 U.S.C. 154(b) by 394 days.

(21) Appl. No.: 13/996,344

(22) PCT Filed: Dec. 20, 2011

(86) PCT No.: PCT/FR2011/053103
§ 371 (c)(1),
(2), (4) Date: Jun. 20, 2013

(87) PCT Pub. No.: WO2012/085456
PCT Pub. Date: Jun. 28, 2012

(65) Prior Publication Data
US 2013/0277775 A1 Oct. 24, 2013

(30) Foreign Application Priority Data

Dec. 20, 2010 (FR) .................................... 10 04967

(51) Int. Cl.
*G01C 19/56* (2012.01)
*B81B 3/00* (2006.01)
*G01C 19/5656* (2012.01)
*G01C 19/5747* (2012.01)

(52) U.S. Cl.
CPC .......... *B81B 3/0018* (2013.01); *G01C 19/5656* (2013.01); *G01C 19/5747* (2013.01)

(58) Field of Classification Search
CPC .................. G01C 19/5656; G01C 19/5747
USPC ..................................................... 73/504.12
See application file for complete search history.

(56) References Cited

U.S. PATENT DOCUMENTS

| 6,539,804 B1 | 4/2003 | Iwata |
| 2002/0033653 A1 | 3/2002 | Janiaude et al. |
| 2004/0112134 A1 | 6/2004 | Beitia |
| 2010/0236327 A1 | 9/2010 | Mao |

FOREIGN PATENT DOCUMENTS

| FR | 2741151 A1 | 5/1997 |
| WO | 9817973 A1 | 4/1998 |

OTHER PUBLICATIONS

European Patent Office, International Search Report issued in corresponding PCT application No. PCT/FR2011/053103, dated Jul. 26, 2012.
English Translation of Abstract for French Patent No. FR2741151.

*Primary Examiner* — John Chapman, Jr.
(74) *Attorney, Agent, or Firm* — Patzik, Frank & Samotny Ltd.

(57) ABSTRACT

An inertial sensor for measuring information relating to rotation in three orthogonal axes, comprising a support and a vibrating sensitive element secured to the support; the sensitive element having a deformable frame and at least two deformable projections which extend in a plane (X-Y); wherein the inertial sensor extends in the same plane; the deformable frame and the at least two deformable projections have a plane of symmetry parallel to the plane; the at least two projections are rectilinear beams which have an approximately square cross section, are not collinear and are preferably approximately orthogonal to one another; each of the deformable beams being connected by only one end to the deformable frame at a location at which the amplitude of the primary vibration mode is at a maximum; and in that the sensor has a device for detecting each of the secondary vibration modes.

15 Claims, 5 Drawing Sheets

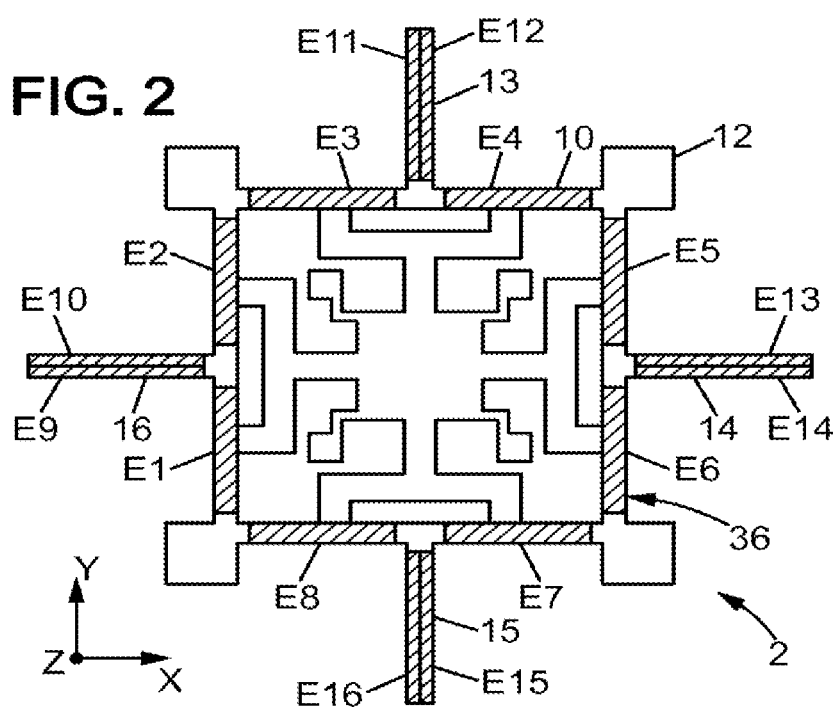
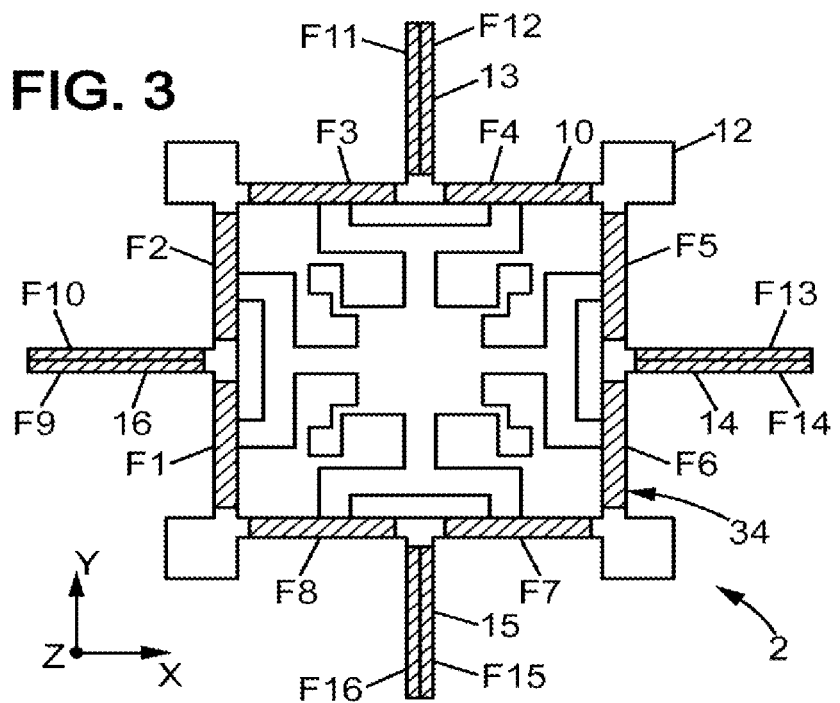

PLANAR STRUCTURE FOR A TRIAXIAL GYROMETER

FIELD OF THE INVENTION

The invention relates to an inertial sensor. In particular, the invention relates to an inertial sensor that operates as a Coriolis vibratory gyroscope (a gyroscope is also referred to herein as a gyrometer) and is able to measure information relating to rotation in three orthogonal axes. This information is the rotational speed of the vehicle in relation to each axis.

Such an inertial sensor is used, for example, to address the need for controlling the attitude of a vehicle. Moreover, it is sometimes combined with accelerometers to make a six-axis inertial unit to assist with the navigation and piloting of a vehicle, and possibly combined with magnetometers to produce a nine-axis inertial unit to allow orientation of the vehicle relative to the earth's magnetic field.

BACKGROUND OF THE INVENTION

A Coriolis Vibratory Gyroscope (CVG) comprises a sensitive element suitable for vibrating in at least one primary vibration mode when excited by an excitation device. Such a sensor possesses one or more specific axes, called "sensitive axes," characterized in that when the inertial sensor is rotated around any instantaneous axis of rotation and when its sensitive element vibrates in a primary vibration mode, then said sensitive element vibrates by the Coriolis effect in a secondary vibration mode with an amplitude proportional to the projection of the instantaneous vector of rotation on said sensitive axis. Said secondary vibration mode is specific to the geometry of the sensitive element, to the primary vibration mode, and to the sensitive axis in question. The vibration amplitude of each secondary mode is measured by a detection device in order to determine the projection of the rotational speed of the vehicle on the sensitive axis which is associated with said secondary vibration mode.

The principle of CVG gyroscopes is a concept particularly suitable for miniaturization and therefore is particularly employed in the production of micro-electro-mechanical system (MEMS) gyroscopes, considering that what is referred to as a micro-electro-mechanical system is a mechanical device comprising one or more movable parts, of which at least one dimension is less than one millimeter and the production of which is carried out by technological methods conventionally used in the field of electronics and microtechnology.

Thus, MEMS-type CVG gyroscopes are particularly well-suited for applications requiring devices of reduced size, such as space applications, the guidance and control of UAVs, etc.

However, a common disadvantage of CVG inertial sensors is the appearance on detection devices of an additional signal, which is representative of the primary vibration only and not of the rotational speed to be measured. This additional signal is detrimental to the proper functioning of the gyroscope, as it degrades the quality of the measurement. It is therefore necessary to implement complex electronic processing for existing CVG gyroscopes in order to eliminate this additional signal and obtain the rotational speed measurement.

The origin of this additional signal can be linked to multiple physical phenomena of different types. One of these phenomena, well known to one skilled in the art, is commonly referred to as "mechanical coupling." This is an unfortunate coupling between the secondary vibration mode and the primary vibration mode(s) which causes the primary vibration to induce a vibratory motion in the secondary vibration modes and vice versa. The mechanical coupling thus leads to an additional signal appearing in the detection system, even when there is no rotation of the gyroscope.

The origin of the additional signal also can be linked a lack of selectivity in the detection device. Indeed, it is common for the detection devices used to detect secondary vibrations also to be suitable for detecting, even with low sensitivity, the vibration of the primary vibration mode. Thus, an additional signal appears in the detection system in the absence of any rotation of the gyroscope, which requires electronic processing and which degrades the quality of the rotational speed measurements.

The appearance of such an additional signal is a recurring deficiency in the prior art, which the invention aims to overcome.

Most existing Coriolis gyroscopes are single-axis, i.e., they measure the rotation relative to a single sensitive axis. An example of a single-axis CVG gyroscope exploiting the vibrations of a quartz tuning fork planar structure is described in patent application FR 2 789 171. In order to characterize the motion of a vehicle, it is thus necessary to use an assembly of at least three single-axis gyroscopes to determine rotational information in the three degrees of rotational freedom of the vehicle.

One particular family of CVGs groups the monolithic dual-axis CVGs. The use of such an inertial sensor allows obtaining a vehicle's rotational information in two axes, with a single device. However, similarly to single-axis Coriolis gyroscopes, it is necessary to use an assembly of at least one single-axis CVG and a dual-axis CVG to determine rotational information in the three degrees of rotational freedom of the vehicle.

An example of this family of inertial sensors, made of bent sheets, is described in U.S. Pat. No. 6,539,804. In the example cited, the structure of the gyroscope is composed, among other things, of a vibration ring and four non-deformable masses connected to the upper face of the ring by coupling elements. In the operation presented, the secondary vibration mode corresponds to out-of-plane movements of the masses, and the detection system for the secondary modes relies on evaluating the stresses generated in the coupling elements by the out-of-plane movements of the masses using piezoelectric ceramics brought to the surface of said coupling elements. The primary vibration mode is a deformation of the ring, intended to cause the masses to vibrate radially; however, as the masses are located on the upper face of the ring, the radial movement of the masses is necessarily accompanied by an out-of-plane movement similar to the vibration of the secondary modes. This therefore produces a mechanical coupling between the primary vibration mode and the secondary vibration mode that causes an additional signal to appear on the detection device and degrades the rotational speed measurement.

Furthermore, the method in the example cited above is based on die-cutting and bending a steel sheet, which is incompatible with MEMS technologies and therefore not conducive to miniaturization.

Another particular family of CVG gyroscopes includes monolithic tri-axis CVGs. The use of such an inertial sensor allows obtaining a vehicle's rotational information in three axes using a single device, dispensing with the step of assembling single-axis and dual-axis inertial sensors, and thereby gaining further compactness.

Such a tri-axis inertial sensor requires designing a structure excited by one or more primary vibration modes coupled by Coriolis force to at least three different secondary vibration modes. For example, document FR 2 821 422 presents the possibility of creating a planar monolithic structure for a tri-axis gyroscope by monolithically combining two planar sub-elements: one of the sub-elements is a planar structure for a single-axis gyroscope with an out-of-plane sensitive axis (Z axis) and the other sub-element is a planar structure for a dual-axis gyroscope, inspired by document FR 2 741 151, having its two sensitive axes in the plane of the substrate (X and Y axes). The operation of such a gyroscope thus requires the excitation of the primary vibration mode of each of the sub-elements and therefore requires the use of two distinct excitation devices. This leads to electronic excitation systems that can be complex and cumbersome.

In order to reduce the bulkiness, the complexity, and the power consumption of the excitation device of an inertial sensor in the tri-axis CVG family, it is of interest to use only one primary vibration mode, and to couple this primary vibration mode to each of the three secondary vibration modes.

Patent application WO 98 17973 describes a monolithic tri-axis CVG gyroscope, compatible with MEMS technologies and using a single primary vibration mode. However, this gyroscope uses the same system of electrodes to detect the amplitudes of the primary vibration mode as well as two of its secondary vibration modes (corresponding to the X and Y axes). Due to this, by its very design it presents a lack of selectivity of the detection devices, such that the electrical signals representative of the rotation information for the X and Y axes are not only added together, but are also added to an additional electrical signal representative of the vibration mode. It is thus necessary to implement complex electronic processing of the signals issuing from said electrodes in order to eliminate this additional signal issuing from the primary vibration mode and separate out the information representative of the rotational speeds on the two sensitive axes X and Y.

US patent 2010/0236327 A1 describes a monolithic tri-axis gyroscope compatible with MEMS technologies and only using a single primary vibration mode. This gyroscope presents a lack of selectivity of the detection systems. Indeed, in this device, the secondary vibration mode corresponding to the rotation on the X axis corresponds to an out-of-plane movement of the masses 22 and 26. The amplitude of this movement is detected by measuring the variation in the values from the capacitors 82 and 86. However, according to the laws of physics, the values from the capacitors 82 and 86 are also somewhat sensitive to the movements within the plane of the masses 22 and 26 induced by the primary movement. These values from the capacitors 82 and 86 are also slightly sensitive to the rotations of the same masses 22 and 26 during the secondary vibration corresponding to the rotation on the Z axis. As a result, the electrical signal representative of the information relating to rotation on the X axis is added to the additional electrical signals representative of the vibration of the primary mode and of the secondary vibration mode Z. It is then necessary to implement a complex electronic processing of the signals in order to separate the information representative of the rotational speed on the X axis from the additional noise issuing from the primary vibration mode and secondary vibration mode Z.

Moreover, in order to guarantee measurements of rotational speeds with the same accuracy in the three axes, it is important that the gyroscope sensitivities be substantially the same in the three sensitive axes. To this effect, a Coriolis coupling coefficient is defined. It represents the capacity of a sensitive element to vibrate according to a Coriolis force-induced secondary vibration mode when it is excited in a primary vibration mode and is made to rotate about the sensitive axis associated with said secondary vibration mode. The Coriolis coupling coefficient can be quantified by the following relationship:

$$K = \left\| \frac{1}{V} \int \int \int_V \vec{u}_{pilote} \wedge \vec{u}_{detection} \right\|$$

in which
$\vec{u}_{pilote}$ is the displacement vector which characterizes the vibration of the primary mode,
$\vec{u}_{detection}$ is the displacement vector which characterizes the vibration of the secondary mode, and
V is the volume of the structure.

Obtaining three equivalent sensitivities for the tri-axis gyroscope involves the use of a vibrating structure in which the Coriolis coupling coefficients are substantially identical for the three sensitive axes. A gyroscope having a sensitivity in one axis that is much higher than its sensitivity in another axis cannot truly be used in a satisfactory manner to determine rotational information for its three sensitive axes.

SUMMARY OF THE INVENTION

The present invention allows overcoming the outlined problems of the prior art. It proposes a monolithic tri-axis structure for CVG gyroscopes in which the Coriolis coupling coefficients are substantially the same in the different sensitive axes, and in which the secondary vibration modes are protected from the influence of the primary vibration mode.

To this effect, one object of the invention is an inertial sensor able to measure information relating to rotation in three orthogonal axes (X, Y, Z); said inertial sensor comprising a support and a sensitive element secured to the support; said sensitive element being adapted to vibrate relative to the support in a primary vibration mode when it is excited by an excitation device, and in secondary vibration modes induced by a Coriolis force, when the inertial sensor is moved about an axis and the sensitive element is excited by an excitation device; said sensitive element comprising a deformable frame which extends within a plane (X-Y) and at least two deformable projections which extend within the same plane (X-Y).

Said at least two deformable projections are slender; each of said deformable projections are only connected by one end to the deformable frame, so that, in the primary vibration mode, each of these said deformable projections is translated along its longitudinal axis without deformation or stress, and so that the Coriolis coupling coefficients between the primary vibration mode and each of the secondary vibration modes are substantially equal, thus allowing on the one hand said inertial sensor to possess substantially equal sensitivities for measuring the information relating to rotation in the three orthogonal axes (X, Y, Z), and on the other hand the secondary vibration modes to be insensitive to the vibration of the primary vibration mode.

The projections being translated along their longitudinal axis without deformation or stress, the inertial sensor is insensitive to the vibration of the primary vibration mode in the absence of rotation.

In certain embodiments of the invention, the inertial sensor comprises one or more of the following characteristics:
the inertial sensor extends within a same plane,
each of said deformable projections comprises an end which is connected to the deformable frame at a location at which the amplitude of the primary vibration mode is at a maximum, the support, the deformable frame, and the deformable projections have a plane of symmetry parallel to the plane formed by the deformable frame and the deformable projections, each deformable projection comprises a beam whose thickness in the Z direction is substantially identical to the thickness (in the Z direction) of the deformable frame, the inertial sensor further comprises one or a plurality of fasteners connecting the support to the deformable frame, said fasteners being fixed substantially at the nodes of vibration of the secondary vibration modes, each fastener comprises a fastening arm connected to the support and two fastening legs connected to the fastening arm and to the deformable frame, each fastening leg having a general L-shape, the inertial sensor comprises fastening areas connected to the support by flexible fastening tabs, the inertial sensor further comprises a device for detecting each of the secondary vibration modes; said detection device exploiting an effect caused by the deformation of the deformable projections, such as for example piezoelectric, piezoresistive, photoelectric, and magnetostrictive effects; due to which said detection device is insensitive to the vibration of the primary vibration mode, at least one face of the deformable projections comprises at least two adjacent detection electrodes which extend along the longitudinal axis of the deformable projections, said inertial sensor is a micro-electro-mechanical system (MEMS), whose thickness along the Z axis is less than 1 mm and preferably less than 500 μm, the inertial sensor is monolithic, the inertial sensor possesses three planes of symmetry along (X, Y), (X, Z) and (Y, Z), the inertial sensor further comprises inertial masses secured to the deformable frame (10); said inertial masses being arranged substantially between two adjacent deformable projections, the cross-section of each projection gradually increases from its end toward the frame.

BRIEF DESCRIPTION OF THE DRAWINGS

The invention will be better understood on reading the following description, given solely by way of example and with reference to the drawings:

FIG. 2 is a front view of the upper face of the inertial sensor according to the invention;

FIG. 3 is a front view of the lower face of the inertial sensor according to the invention;

DETAILED DESCRIPTION OF THE INVENTION

Figure 1:
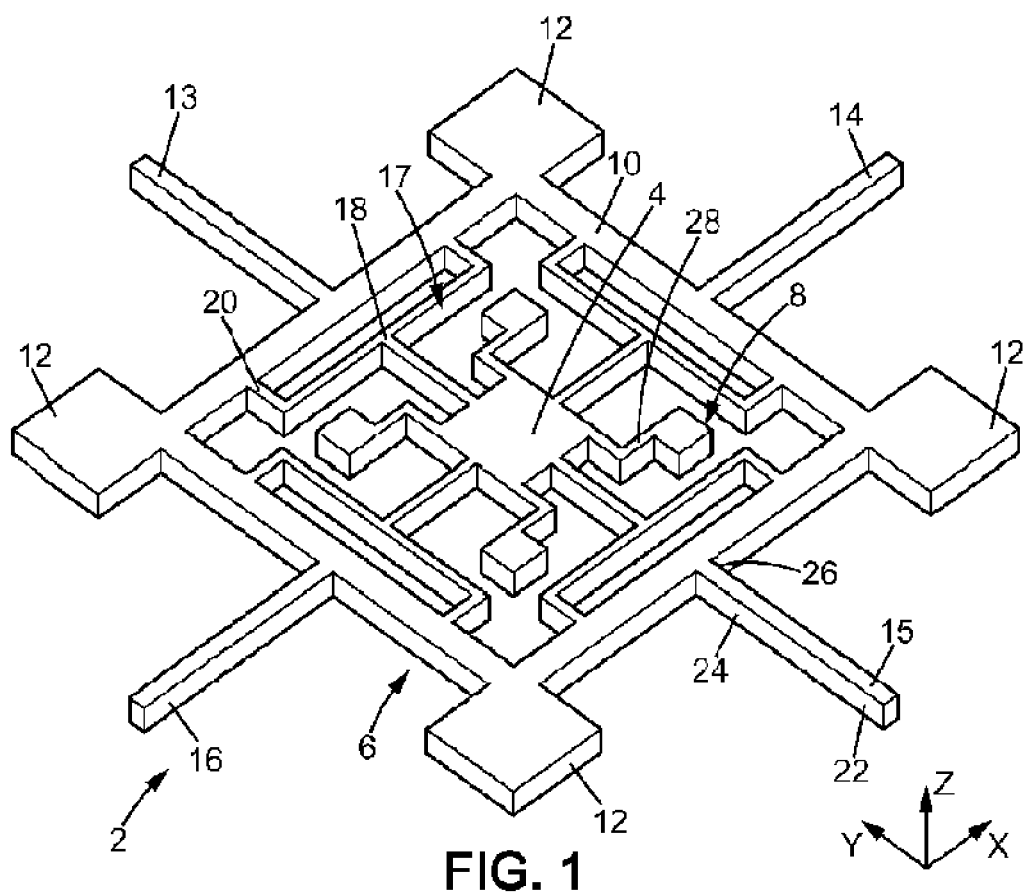
FIG. 1 is a schematic perspective view of the inertial sensor according to the invention.

In reference to FIG. 1, the inertial sensor 2 comprises a support 4, a sensitive element 6, and fastening areas 8. In the configuration presented in FIG. 1, the support 4 is positioned at the center of said inertial sensor.

The sensitive element 6 comprises a deformable polygonal frame 10, particularly one that is square in shape, equipped with an inertial mass 12 at each of its corners, and with four deformable projections 13, 14, 15, 16.

In a variant, the deformable frame 10 may for example be rectangular, diamond-shaped, or circular.

The support 4 and the sensitive element 6 form a planar structure which extends within a same plane (X, Y).

The deformable projections 13, 14, 15, 16 are slender. They extend within the same plane (X, Y) as the deformable frame 10 and the support 4.

In the embodiment illustrated in FIG. 1, the deformable projections 13, 14, 15, 16 are formed by beams which have, for example, a thickness along the Z direction that is substantially the same as the thickness of the deformable frame 10.

The longitudinal axes of said at least two deformable projections 13, 14, 15, 16 are non-collinear and preferably are substantially orthogonal.

As is visible in FIG. 1, the deformable projections 13, 14, 15, 16 have a free end 22 and a connected end 24 that is attached to the deformable frame 10 at a location at which the amplitude of vibration of the primary vibration mode is at a maximum.

For example, in the embodiment illustrated in FIG. 1, the connected end 24 of each deformable projection is attached substantially to the middle of each side of the deformable frame 10, equidistant from two adjacent inertial masses 12.

The connected end 24 of the deformable projections is attached to the deformable frame 10 by a joint 26.

The support 4, the deformable frame 10, and the deformable projections 13, 14, 15, 16 form a symmetrical structure relative to the planes (X, Y), (X, Z) and (Y, Z) passing through the center of the support 4.

The deformable frame 10 is connected to the support 4 by fasteners 17 which maintain and which allow the deformation of the deformable frame 10.

The four inertial masses 12 are, for example, square. Their size and mass have been defined so as to modify the inertia of the deformable frame 10 such that the support 4 remains unmoving during the deformation of the secondary vibration modes, during the rotations around the X and Y rotational axes.

The fasteners 17 each comprise a fastening arm 18 connected to the support 4 and two L-shaped fastening legs 20. Each fastening leg 20 is connected, on the one hand, to the fastening arm 18, and on the other hand, to the deformable frame 10 at a position of the deformable frame 10 which minimizes the vibration of the support 4 and thereby minimizes leakage of vibration energy through the fastening areas 8.

Specifically, the fastening legs 20 are connected to the deformable frame 10 substantially at the level of the nodes of vibration of the secondary vibration modes of the inertial sensor. In the embodiment represented, each of the fastening legs 20 is connected to the deformable frame 10 at a location between one of the inertial masses 12 and one of the deformable projections 13, 14, 15, 16 adjacent to said inertial mass.

The fastening areas 8 are connected to the support 4 by flexible fastening tabs 28. The fastening tabs 28 are, preferably, bent in a manner that achieves a filtering suspension which minimizes leakage of vibration energy.

The fastening areas 8 are, for example, square and extend within the (X, Y) plane. The lower faces of these fastening areas are to be glued to the device which is to have its angle, speed, or acceleration of rotation measured.

In reference to FIGS. 2 and 3, the inertial sensor 2 according to the invention further comprises excitation electrodes and a voltage generator electrically connected to the excitation electrodes in order to cause the sensitive element 6 to vibrate in the primary vibration mode, and detection electrodes connected to a signal processing unit that is able to compute the information relating to rotation in the three axes X, Y, and Z using the signals measured by the detection electrodes.

An example arrangement of the excitation electrodes and the detection electrodes is illustrated in FIGS. 2 and 3 for an inertial sensor produced in a gallium arsenide substrate cut in the normal crystal plane 100, and using a piezoelectric detection and excitation method.

According to this exemplary embodiment, the excitation electrodes and the detection electrodes are formed by metal traces E1 to E16 deposited on a face, called the lower face 36, and F1 to F16 deposited on its opposite face, called the upper face 34.

In particular, the excitation electrodes are deposited on the upper (34) and lower (36) faces of the deformable frame 10. The detection electrodes are deposited on the upper 34 and lower 36 faces of the deformable projections 13, 14, 15, 16.

The inertial sensor 2 is, for example, excited in the primary vibration mode by applying an alternating electric potential to a group of electrodes P1 comprising the excitation electrodes denoted E1, E3, E5, E7, F2, F4, F6, F8, and a different alternating electric potential to a group of electrodes P2 comprising the excitation electrodes denoted E2, E4, E6, E8, F1, F3, F5, F7.

Excitation electrodes in one group of electrodes are arranged facing the excitation electrodes in the other group of electrodes, and each side of the deformable frame 10 comprises an electrode from each group of electrodes. The detection electrodes are arranged face to face on the faces of the deformable projections 13, 14, 15 and 16 so that each face of the deformable projections 13, 14, 15 and 16 comprises two adjacent electrodes which extend along the longitudinal axis of said deformable projections 13, 14, 15 and 16.

The frequencies of the electrical signals applied to each group of excitation electrodes are the same and correspond to the resonance frequency of the primary vibration mode. The excitation device comprises an electronic circuit which controls the excitation of the primary vibration mode at its resonance frequency.

The information relating to rotation on the X rotational axis is determined by subtracting the charges collected on a group of electrodes DX1 comprising the detection electrodes denoted E11, E16, F11, and F16 from the charges collected on another group of electrodes DX2 comprising the detection electrodes denoted E12, E15, F12, and F15, by means of a differential charge amplifier.

The information relating to rotation on the Y axis is determined by subtracting the charges collected on a group of electrodes DY1 comprising the detection electrodes denoted E9, E14, F9, and F14 from the charges collected on another group of electrodes DY2 comprising the detection electrodes denoted E10, E13, F10, and F13, by means of a differential charge amplifier.

The information relating to rotation on the Z axis is determined by subtracting the charges collected on a group of electrodes DZ1 comprising the detection electrodes denoted E9, E10, E11, E12, E13, E14, E15, and E16 from the charges collected on another group of electrodes DZ2 comprising the detection electrodes denoted F9, F10, F11, F12, F13, F14, F15 and F16.

There are multiple methods which can be considered for exciting the sensitive element 6, as well as for detecting its vibration, depending on the materials used in the manufacture of the sensitive element.

An electrostatic excitation method can, for example, be used for a sensitive element 6 manufactured from any type of material. A piezoelectric excitation and detection method can be used for a sensitive element 6 formed in quartz, gallium arsenide, gallium nitride, aluminum nitride, zinc oxide, etc. A capacitive detection method can be used for a sensitive element 6 made from any type of material. Similarly, an optical detection method can be performed with any type of material. Finally, a piezoresistive detection method can be used when the sensitive element 6 is made from any material having piezoresistive properties such as silicon, gallium arsenide, etc.

Figure 4:
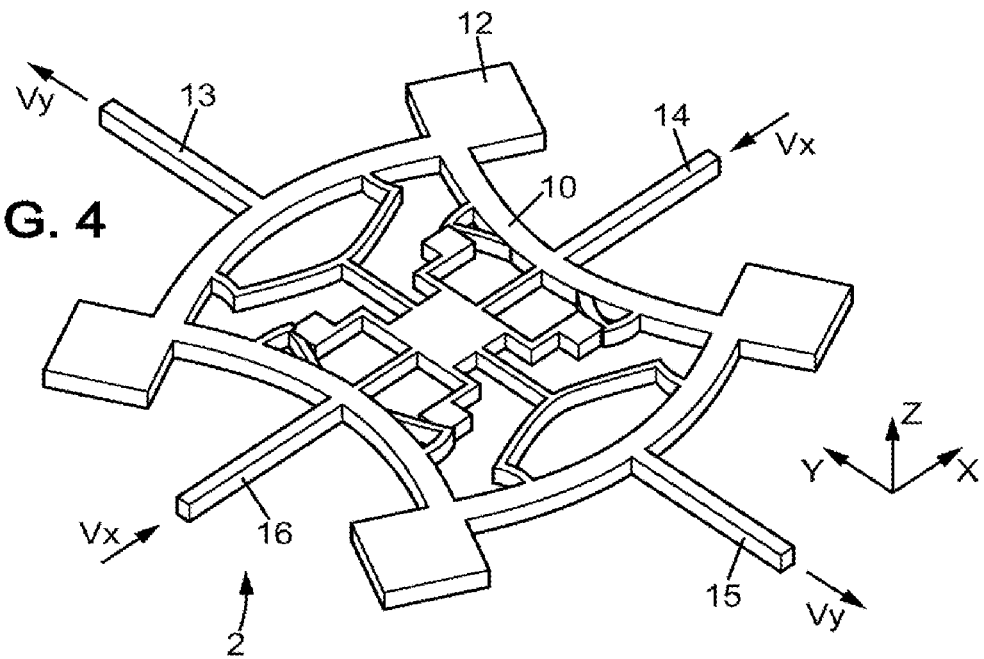
FIG. 4 is a perspective view of the inertial sensor illustrated in FIG. 1 when it is excited in the primary vibration mode.

In reference to FIG. 4, when the sensitive element 6, and specifically the deformable frame 10 in the exemplary embodiment represented, is excited in the primary vibration mode, the deformable projections 13 and 15 are driven in a Vy translational movement along the Y axis without being deformed, as illustrated in FIG. 4. Similarly, the deformable projections 14 and 16 are driven in a Vx translational movement along the X axis without deformation.

Thus, when the sensitive element 6 is excited in the primary vibration mode, each deformable projection 13, 14, 15, 16 is translated along its longitudinal axis without deformation or stress. This pure translation of the deformable projections 13, 14, 15, 16 is assured by the existence of a median plane of symmetry of the structure 6, parallel to the (X, Y) plane. In effect, if the position of the deformable projections is offset toward one of the faces of the deformable frame 10, as in the case of U.S. Pat. No. 6,539,804 B1, the translation of the deformable projections 13, 14, 15, 16 would necessarily be accompanied by an out-of-plane bending deformation around the joint 26 which could be combined by the detection systems with one of the secondary vibrations and would thus cause an error in the measurement of the rotational information. The existence of said plane of symmetry parallel to (X, Y) avoids this parasite bending. The use of a detection system that exploits the deformation of the deformable projections 13, 14, 15, 16 assures that there are no signals on the detection electrodes (E9 to E16 and F9 to F16) in the absence of any rotation, and avoids the superimposition on the detection signals of an additional electrical signal connected to the primary vibration. The detection system can take advantage of physical phenomena that couple the deformation of a material to another electromagnetic variable; these physical phenomena may be, for example, piezoelectricity, magnetostriction, piezoresistivity, photoelasticity, etc.

Figure 5:
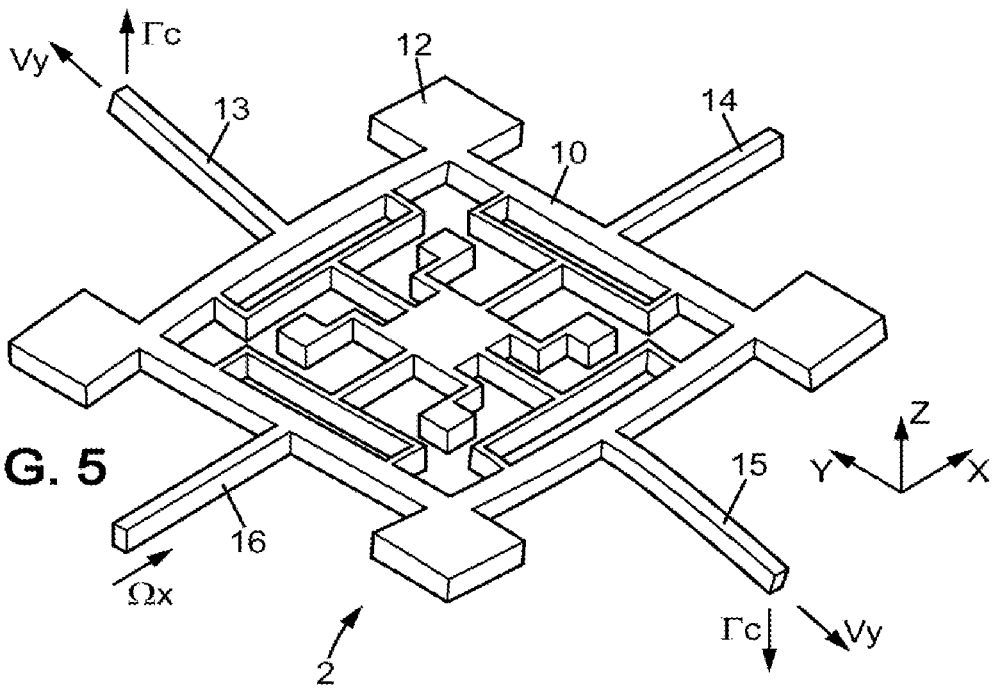
FIG. 5 is a perspective view of the deformation of the secondary vibration mode of the inertial sensor of FIG. 1 when a rotational speed is applied along the X sensitive axis.

In reference to FIG. 5, when the sensitive element 6 is excited in the primary vibration mode and the inertial sensor is pivoted about the X rotational axis with a $\Omega x$ rotational speed, the Coriolis force generates $\Gamma c$ accelerations oriented on the Z axis on the deformable projections 13 and 15. The Coriolis force causes an out-of-plane bending deformation (X, Y) of the deformable projections 13 and 15, as illustrated in FIG. 5.

Figure 6:
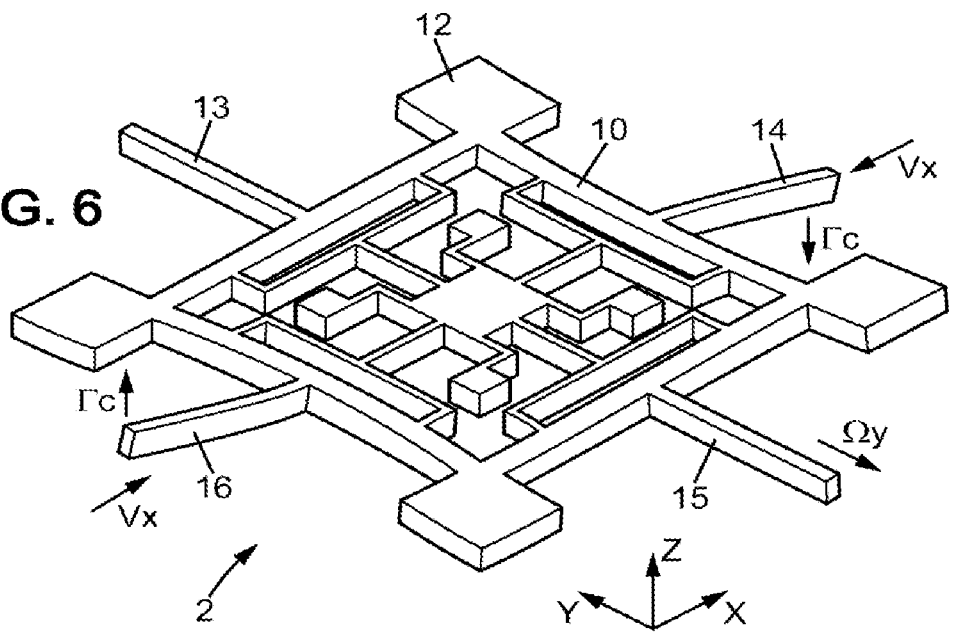
FIG. 6 is a perspective view of the deformation of the secondary vibration mode of the inertial sensor of FIG. 1 when a rotational speed is applied along the Y sensitive axis.

In reference to FIG. 6, in a similar manner, when the sensitive element 6 is excited in the primary vibration mode and the inertial sensor is pivoted about the Y rotational axis with a Ωy rotational speed, the Coriolis force generates Γc accelerations oriented on the Z axis on the deformable projections 14 and 16. The Coriolis force thus causes the out-of-plane bending (X,Y) of the deformable projections 14 and 16, as illustrated in FIG. 6.

Figure 7:
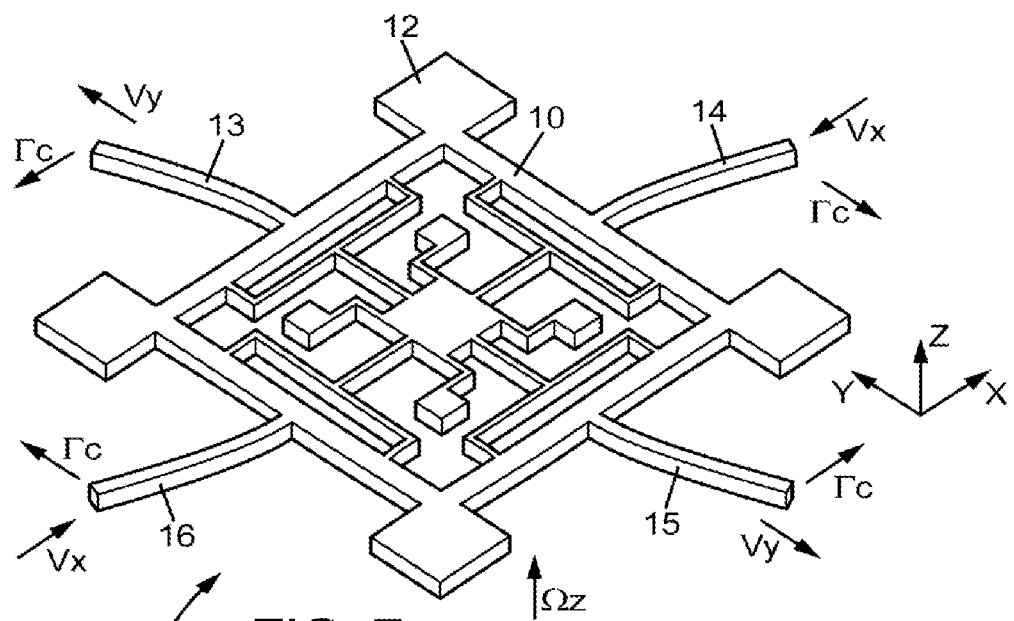
FIG. 7 is a perspective view of the deformation of the secondary vibration mode of the inertial sensor of FIG. 1 when a rotational speed is applied along the Z sensitive axis.

In reference to FIG. 7, when the sensitive element 6 is excited in the primary vibration mode and the inertial sensor is pivoted about the Z rotational axis with a Ωz rotational speed, the Coriolis force generates Γc accelerations on the X axis for the deformable projections 13 and 15 and oriented on the Y axis for the deformable projections 14 and 16. The deformations thus obtained by these accelerations correspond to a flexure of each of the four deformable projections in the X-Y plane, as illustrated in FIG. 7.

A detection device comprising the detection electrodes and the signal processing unit is able to detect these deformations and to calculate information relating to rotation for the three X, Y, Z axes from these deformations.

The Coriolis coupling coefficients between the primary vibration mode and each of the secondary vibration modes are substantially the same, so that said inertial sensor possesses substantially the same sensitivities for measuring the information relating to rotation for each of said three orthogonal axes (X, Y, Z).

Figure 8:
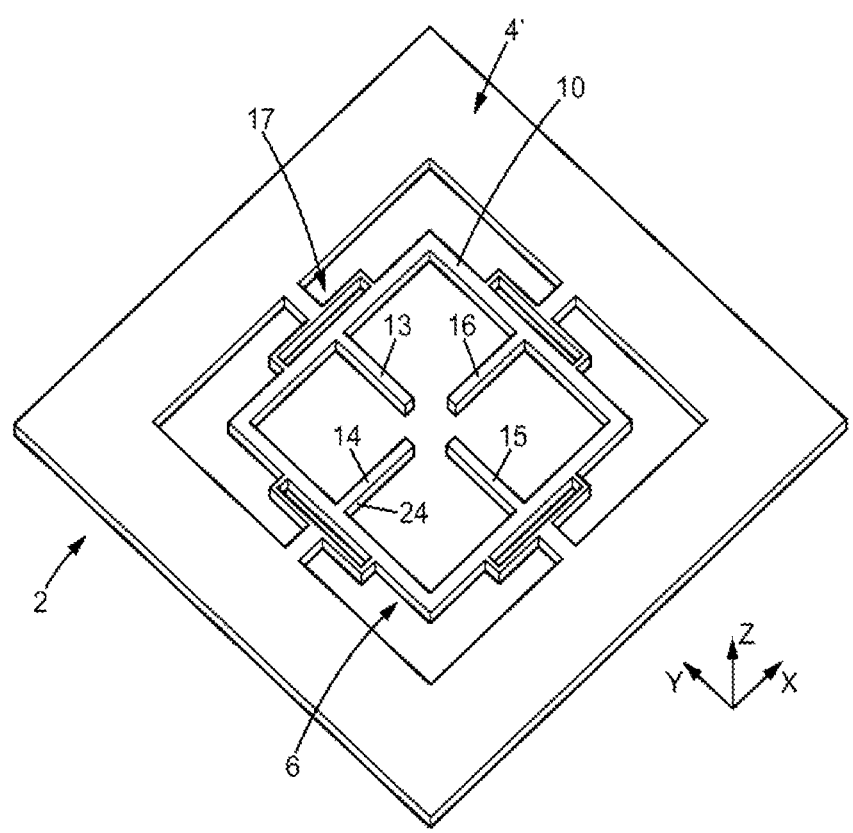
FIG. 8 is a schematic perspective view of a variant of the inertial sensor.

In reference to FIG. 8, in one variant configuration of the inertial sensor 2, the support 4' is arranged on the outside of the deformable frame 10. In particular, the support 4' is a polygonal frame. The sensitive element 6 is thus located inside the support 4. In this configuration, there are no fastening areas 8 or fastening tabs 28. The mass of the support 4', substantially larger than the sensitive element 6, provides a natural decoupling of the vibrations from the sensitive element 6, due to inertia. Thus, it is possible to glue one of the faces of the support 4' to the device for which the angle, speed, or acceleration of rotation is to be measured, while minimizing leakage of vibration energy. Thus, the support 4' in the device in FIG. 8 acts as the support 4, fastening areas 8, and fastening tabs 28 of the device illustrated in FIG. 1. In the case of an embodiment using MEMS-associated technological methods, this configuration allows the structures to be maintained by their peripheral edges and thus facilitates wafer encapsulation operations, for collectively conditioning the inertial sensors.

In one particular embodiment, the inertial sensor 2 according to the invention is advantageously made from a material normally used in the electronics and micromechanical sector such as, for example, silicon, a III-V semi-conductor material (such as gallium arsenide, gallium nitride, or indium phosphide, etc.), a II-VI semi-conductor material (such as zinc oxide, etc), or any other material containing piezoelectric properties (such as quartz, gallium orthophosphate, or lithium niobate, etc.).

In one particular embodiment, the inertial sensor 2 according to the invention is advantageously made by etching a monolithic plate of the selected material, flat and of a constant thickness. Such a plate is called a substrate. The inertial sensor 2 is therefore monolithic and is substantially flat.

In one particular embodiment, the inertial sensor 2 according to the invention is formed in a substrate of a thickness typically less than 1 mm and preferably less than 500 µm. The dimension measured on the Z axis of the deformable projections 13, 14, 15, 16; of the deformable frame 10; and of the support 4 is therefore less than 1 mm, and preferably less than 500 µm.

In a preferred configuration, the out-of-plane thickness of the device is 500 µm, the width of the plane of the deformable projections is 400 µm, and the length of the deformable projections is 3 mm. The in-plane width of each of the sides of the deformable frame is approximately 5 mm.

In one particular embodiment, the inertial sensor 2 according to the invention is advantageously a micro-electro-mechanical system (MEMS).

Advantageously, the inertial sensor is able to be produced according to the collective machining methods used for MEMS, such as, for example, photolithography, chemical etching, reactive ion etching, etc.

In one particular embodiment, the inertial sensor 2 forms a single-thickness planar structure (X, Y).

In one particular embodiment, the deformable projections 13, 14, 15, 16 further have a substantially square cross-section, which advantageously creates, due to their slender shape, Coriolis coupling coefficients between the primary vibration modes and the secondary vibration modes which are substantially equal.

In one particular embodiment, the sensitivities of the device in the three detection axes have maximal values due to the positioning of the deformable projections substantially located where the amplitude of vibration of the deformable frame is largest.

In one particular embodiment, the inertial sensor 2 possesses three planes of symmetry (X, Y), (X, Z) and (Y, Z), which advantageously permits decoupling the vibrations of the secondary modes from each other, so that the vibrations of the secondary modes are independent from one another and it is therefore not necessary to implement a complex electronic processing of signals to eliminate the influence of said parasite vibrations.

Advantageously, the inertial sensor comprises inertial masses and fastening tabs 28 judiciously arranged to decouple the sensitive element from the fastening areas 8 in order to minimize leakage of vibration energy and maintain high quality factors for each secondary vibration mode and for the primary vibration mode, which, among other things, minimizes power consumption.

In one particular embodiment, the cross-section of the joint 26 widens gradually from the projection 13, 14, 15, 16 toward the frame 10; this has the advantage of reducing stresses in the joint 26 and reduces the risk of breaks, for example fatigue failure.

In one particular embodiment, an absence of inertial masses and a positioning of the deformable projections 13, 14, 15, 16 at the corners of the deformable frame 10 are combined.

The invention claimed is:

1. An inertial sensor able to measure information relating to rotation in three (X, Y, Z) orthogonal axes, said inertial sensor comprising: a support and a sensitive element secured to the support; said sensitive element being adapted to vibrate relative to the support in a primary vibration mode when it is excited by an excitation device, and in secondary vibration modes induced by a Coriolis force, when the inertial sensor is moved about an axis and the sensitive element is excited by an excitation device; said sensitive element comprising a deformable frame which extends in a plane (X-Y) and at least two deformable projections which extend in the same plane (X-Y); said primary vibration mode implementing a deformation of the deformable frame; said secondary vibration modes implementing in-plane or out-of-plane bending deformations of said at least two deformable projections wherein: each of said at least two deformable projections is a beam of a substantially square cross-section whose longitudinal axis is rectilinear; each of said beams being connected only by one of its ends to the deformable frame at a location at which the amplitude of the primary vibration mode is at a maximum so that in the primary vibration mode, each of said beams is translated on its longitudinal axis; the inertial sensor extends in one and the same plane; the deformable frame and said at least two deformable projections possess a plane of symmetry parallel to the (X-Y) plane, due to which the translation of said at least two deformable projections occurs without deformation or stress; the longitudinal axes of said at least two deformable projections, along which the latter are displaced by the primary vibration, are non-collinear; and the inertial sensor further comprises a device for detecting each of the secondary vibration modes; said detection device exploiting an effect caused by the deformation of said beams.

2. The inertial sensor according to claim 1, wherein the thickness in the Z direction of each of the deformable projections is substantially equal to the thickness in the Z direction of the deformable frame.

3. The inertial sensor according to claim 1, which further comprises one or a plurality of fasteners connecting the support to the deformable frame, said fasteners being fixed substantially at the nodes of vibration of the secondary vibration modes.

4. The inertial sensor according to claim 3, wherein the fasteners each comprise a fastening arm connected to the support and two fastening legs connected to the fastening arm and to the deformable frame, each fastening leg having a general L-shape.

5. The inertial sensor according to claim 1, comprising fastening areas connected to the support by flexible fastening tabs.

6. The inertial sensor according to claim 1, made from a piezoelectric material such as Gallium arsenide; wherein the device to detect each of the secondary vibration modes takes advantage of the piezoelectric effects of the material; and wherein at least one face of the deformable projections comprises at least two adjacent detection electrodes which extend along the longitudinal axis of the deformable projections.

7. The inertial sensor according to claim 1, wherein said inertial sensor is a micro-electro-mechanical system.

8. The inertial sensor according to claim 1, wherein the thickness along the Z axis is less than 1 mm.

9. The inertial sensor according to claim 1, wherein said inertial sensor is monolithic.

10. The inertial sensor according to claim 1, wherein the inertial sensor possesses three planes of symmetry along (X-Y), (X-Z) and (Y-Z).

11. The inertial sensor according to claim 1, further comprising inertial masses secured to the deformable frame; said inertial masses being placed substantially between two adjacent deformable projections.

12. The inertial sensor according to claim 1, wherein the cross-section of each projection gradually increases from its end toward the frame.

13. The inertial sensor according to claim 1, wherein the longitudinal axes of said at least two deformable projections are substantially orthogonal.

14. The inertial sensor according to claim 1, wherein the device for detecting each of the secondary vibration modes exploits one effect selected from the group consisting of a magnetostrictive effect, a piezoelectric effect, a piezoresistive effect, and a photoelectric effect.

15. The inertial sensor according to claim 1, wherein the thickness along the Z axis is less than 500 μm.

* * * * *